US006956420B2

United States Patent
Slawecki

(10) Patent No.: US 6,956,420 B2
(45) Date of Patent: Oct. 18, 2005

(54) DUTY CYCLE COMPENSATION IN CLOCK CIRCUIT

(75) Inventor: Darren Slawecki, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,309

(22) Filed: Sep. 30, 2003

(65) Prior Publication Data

US 2005/0068081 A1 Mar. 31, 2005

(51) Int. Cl.[7] .......................... H03K 3/017; H03K 5/04
(52) U.S. Cl. .................. 327/172; 327/175; 327/299
(58) Field of Search .............................. 327/172, 173, 327/174, 775, 261, 264, 291, 299

(56) References Cited

U.S. PATENT DOCUMENTS

| | | | |
|---|---|---|---|
| 4,706,044 A | 11/1987 | Okrzesik et al. | 331/113 R |
| 5,061,907 A | 10/1991 | Rasmussen | 331/57 |
| 5,467,464 A | 11/1995 | Oprescu et al. | 713/400 |
| 5,834,968 A * | 11/1998 | Imamiya | 327/552 |
| 5,907,254 A * | 5/1999 | Chang | 327/165 |
| 6,127,858 A | 10/2000 | Stinson et al. | 327/99 |
| 6,333,655 B1 * | 12/2001 | Ishizuka | 327/175 |
| 6,373,309 B1 | 4/2002 | Bang | 327/175 |
| 6,456,133 B1 | 9/2002 | Nair et al. | 327/175 |
| 6,564,347 B1 | 5/2003 | Mates | 714/727 |
| 6,680,637 B2 * | 1/2004 | Seo | 327/175 |
| 2001/0030562 A1 * | 10/2001 | Kim et al. | 327/175 |
| 2004/0135608 A1 * | 7/2004 | Pillay et al. | 327/175 |

* cited by examiner

*Primary Examiner*—Tuan T. Lam
(74) *Attorney, Agent, or Firm*—Schwabe, Williamson & Wyatt, P.C.

(57) ABSTRACT

A clock shrink circuit has an inverting first matching stage which is responsive to an input clock signal to generate a first inverted signal having a first matching delay. The first matching delay is a difference between a first rise and a first fall propagation time of the first matching stage. An inverting first pull-up stage is coupled to the first matching stage and is responsive to the first inverted signal to generate a second inverted signal having a first pull-up delay which is substantially reduced by the first matching delay. The first pull-up delay is a difference between a second rise and a second fall propagation time of the first pull-up stage.

24 Claims, 7 Drawing Sheets

DUTY CYCLE COMPENSATION IN CLOCK CIRCUIT

BACKGROUND OF THE INVENTION

1. Field of the Invention

The present invention relates to, but is not limited to, electronic devices, and in particular, to the field of clock circuits.

2. Description of Related Art

Clock signals are basic elements in digital circuits. A clock signal, generated by a clock generator, may be used to trigger flip-flops, serve as a timing reference, provide data and address strobing, and perform many other timing and control functions. To distribute the clock signal to various circuit elements, a clock distribution circuit is used.

The clock pulse signal has a frequency and a duty cycle. The duty cycle is defined as the ratio between the high period over the entire period of the signal. The ideal duty cycle for a clock signal is 50%. The reason clocks become unbalanced, drifting away from the 50% duty cycle, is that a digital logic element may have an asymmetric response to rising and falling waveforms, so that the propagation delay for the logic element differs for rising and falling clock edges. The clock signal propagating through the logic element is either shortened or lengthened by this difference in propagation delay.

Automatic test equipment (ATE) is often used to test and debug critical speed paths on newly designed microprocessors. The ATE is connected to the microprocessor to control a clock shrink circuit, which generates a test clock used to drive one or more functional units contained therein. The functional units include, for example, the data path, input units, execution units, cache, output units, and the like. The clock shrink circuit uses a technique called "clock shrinking", by which the frequency of a clock (or group of clocks) is changed dynamically during the execution of a microprocessor. The term "shrinking" is used to denote that the frequency of a clock cycle of interest is reduced relative to other clock cycles. Clock shrinking is a debug tool for testing newly designed microprocessors and other types of integrated circuits. By shrinking a single clock (and leaving the other clocks at a lower, passing frequency), a single critical path can be isolated in a test or diagnostic that contains many critical speed paths.

FIG. 1 illustrates a prior art, on-chip clock shrink circuit 10 for shifting the phase of a clock signal (CLOCK). The clock shrink circuit 10 includes two identical circuit portions, a rise mirror circuit 12 and a fall mirror circuit 14. Each mirror circuit 12 and 14 includes the same components, with the mirror circuit 12 having a front end inverter 16 with an output signal CLOCKB, an inverting variable pull-up delay stage 18 and an inverting output stage 20 with an output signal CLOCKMID. The fall mirror circuit 14 is shown with an output signal CLOCKOUT.

Referring to FIG. 2, the operation of the clock shrink circuit 10 of the prior art is shown for an illustrative regular frequency (generally below 4 GHz) by showing in a timing diagram of the signals CLOCK, CLOCKB, CLOCKMID, and CLOCKOUT. The signal CLOCKB is an inverted, delayed version of the CLOCK signal, but retains the 50% duty cycle. The delay stage 18 of the rise mirror circuit 12 creates significantly different rise and fall propagation delays as illustrated by the CLOCKMID signal, with the rising input to falling output being much larger than the falling input to rising output. As such, the output duty cycle is significantly different than the input duty cycle, e.g., 50% input duty cycle results in a greater than 70% duty cycle output. In other words, the CLOCKMID waveform is more high than low during this regular frequency operation. With the assistance of the fall mirror circuit 14, the CLOCKOUT signal is the desired delayed clock signal with a 50% duty cycle.

Referring to FIG. 3, the operation of the clock shrink circuit 10 is shown for a high frequency (generally above 4 GHz) by again showing in a timing diagram the signals CLOCK, CLOCKB, CLOCKMID, and CLOCKOUT. As the clock frequency is increased, eventually the shrink circuit 10 becomes a frequency limiter. The CLOCKOUT signal no longer toggles in the high frequency operation.

Although the shrink circuit 10 is generally acceptable for frequencies approximately under 4 GHz, the clock shrink circuit 10 has insufficient bandwidth of operation as a serial circuit in the clock distribution path having frequencies approximately greater than 4 GHz. Currently, the maximum frequency of operation of the shrink circuit 10 is close to the nominal part frequency. This limits the maximum device frequency as the part speed is increased by fixing paths in the design.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 4:
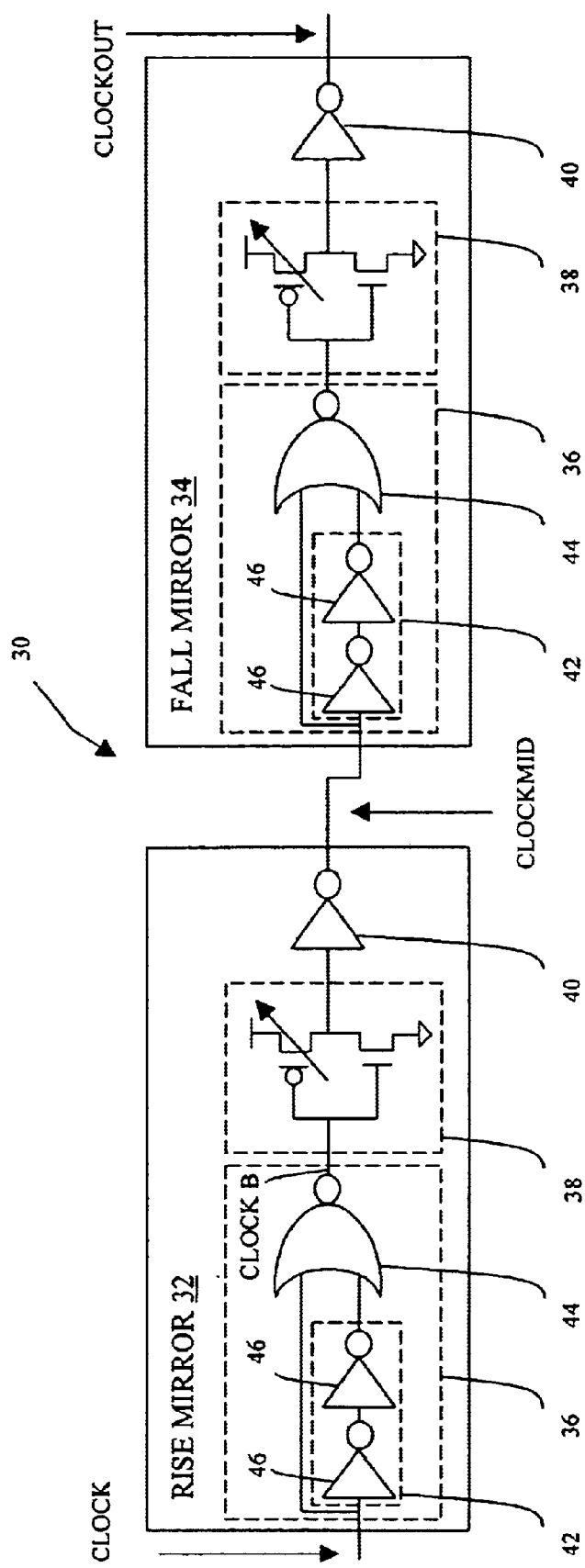
FIG. 4 is a schematic diagram of a clock shrink circuit according to one embodiment of the invention.

FIG. 4 illustrates one embodiment of an on-chip clock shrink circuit 30 for delaying a clock signal (CLOCK). The clock shrink circuit 30 includes two identical circuit portions, a rise mirror circuit 32 and a fall mirror circuit 34. Each mirror circuit 32 and 34 includes the same components. The clock signal, which is generated by a clock generator (not depicted), is provided as an input to the rise mirror circuit 32. The clock generator uses a phase-locked loop ("PLL") to generate the clock with a 50% duty cycle. The rise mirror circuit 32 has an output signal (CLOCKMID), which is coupled to an input of the fall mirror circuit 34. At its output, the fall mirror circuit 34 generates an output signal (CLOCKOUT).

Each of the rise and fall mirror circuits 32 and 34 includes the identical components, which are designated by the same reference numbers. The rise circuit 32 includes an inverting first matching stage 36 for providing a first inverted signal (CLOCKB), an inverting first pull-up stage 38 with a variable phase delay for providing a second inverted signal and an inverting first output stage 40 for providing the third inverted signal CLOCKMID. In other words, all three stages 36, 38 and 40 are inverting stages with inverted output signals.

The first matching stage 36 includes a non-inverting logic element 42 and a NOR gate 44 with one input connected to the input of the non-inverting logic element 42 and the other input coupled to the output of the non-inverting logic element 42.

Likewise, the fall mirror circuit 34 includes an inverting second matching stage 36 to provide a fourth inverted signal, an inverting second pull-up stage 38 with a variable phase delay to provide a fifth inverted signal and an inverting second output stage 40 to provide a sixth inverted signal, the output clock signal (CLOCKOUT), with such output clock signal having the desired phase delay. Since the second stages 36, 38, and 40 are identical in structure to first stages 36, 38, and 40, they will not be described further.

In this illustrative embodiment, each of non-inverting logic elements 42 of the rise and fall mirror circuits 32 and 34 includes at least a pair of cascaded inverters 46. Although two inverters 46 are shown in FIG. 4, any even number of cascaded inverters 46 may be used to match the input and output duty cycles of the rise and fall mirror circuits 32 and 34, as will be described hereinafter. Other combinations of logic elements may provide the function of the first matching stage 36. For example, although two inverters 46 are shown, any non-inverting logic element may be used. For the matching stage 36, other logic configurations that delay one edge more than another may be substituted.

Figure 5:
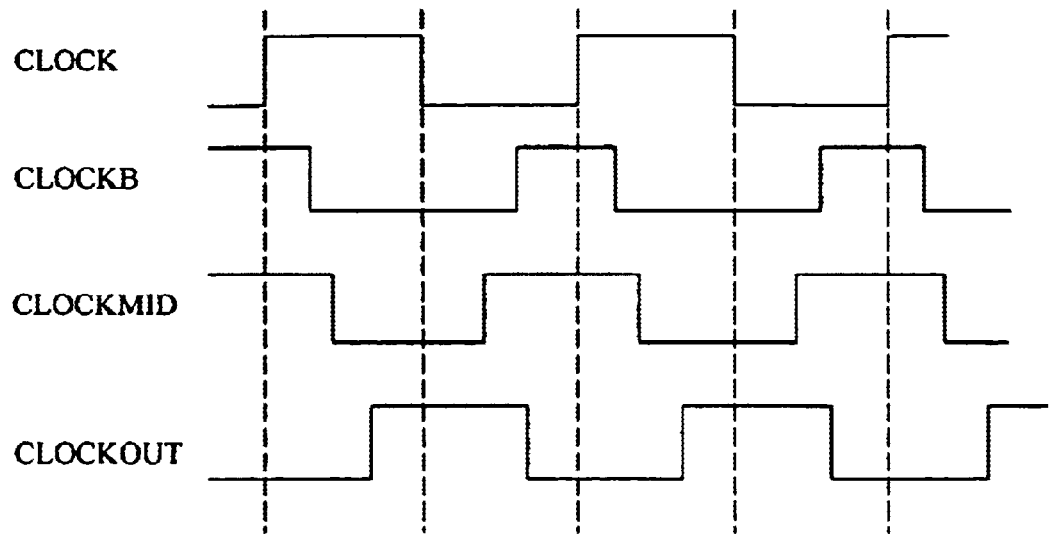
FIG. 5 is a timing diagram for the embodiment of the clock shrink circuit shown in FIG. 4 operating at a regular frequency.

Referring to the timing diagram of FIG. 5, the operation of the one embodiment of the clock shrink circuit 30 is shown wherein the input clock signal (CLOCK) has an illustrative regular frequency (generally below 4 GHz) and a 50% duty cycle. In the rise mirror circuit 32, a first pulse width change is introduced into the first inverted output signal (CLOCKB) of the first matching stage 36. More specifically, the high periods are shortened and low periods are lengthened for the first inverted output signal, causing the duty cycle to drop below the 50% duty cycle. This is caused by the propagation delay of the falling edge of the CLOCK signal through the first matching stage 36 exceeding the propagation delay of the rising edge of the CLOCK signal. Since the first matching stage 36 also provides an inverter function, this leads to the falling edge of signal CLOCKB being delayed less than the rising edge of signal CLOCKB. As will be described hereinafter, the intentional introduction of asymmetric propagation delays (different rise and fall propagation delays) for the first matching stage 36 is intended to cancel the nominal pulse width distortion introduced by the first pull-up stage 38.

The first pull-up stage 38 produces a second inverted signal with a pulse width change (distortion) due to the introduction of asymmetric propagation delays. The second inverted signal is then inverted by the output stage 40 without significant asymmetric propagation delays as shown by third inverted signal (CLOCKMID). The second inverted signal is not shown in FIG. 5, since the CLOCKMID signal fully shows the pulse width distortion introduced by the asymmetric propagation delays of the pull-up stage 38. The signal on the node after CLOCKB signal and before CLOCKMID signal is the same as CLOCKMID signal only inverted. In other words, it has been corrected to be back to a 50% duty cycle. The signal CLOCKMID has returned to an approximately 50% duty cycle, with the pulse width distortion introduced by the first matching stage 36 cancelling out or compensating for the pulse width distortion introduced by the first pull-up stage 38.

In summary, it should be noted that the second inverted signal and the third inverted signal CLOCKMID have returned to an approximately 50% duty cycle of the input clock signal CLOCK. This is because the first matching stage 36 introduces pulse width compression (duty cycle offset) by having different rise and fall propagation delays through the first matching stage 36 which cancels out the pulse width expansion of the pull-up stage 38. The amount of pulse width compression of the first matching stage 36 substantially equals the amount of pulse width expansion of the first pull-up stage 38.

With respect to the rise mirror circuit 32, the first matching stage 36 introduces a first pulse width change deviating from a 50% duty cycle to cancel out a second pulse width change (distortion) caused by the first pull-up stage 38 to achieve a substantially 50% duty cycle. In other words, the first matching stage 36 creates a first matching delay (difference between the rise and fall propagation delays of the first matching stage 36) to compensate for or cancel a first pull-up delay (difference between the rise and fall propagation delays of the first pull-up stage 38). The first matching and first pull-up delays have substantially equal but opposite effects on the pulse widths and therefore the duty cycle. It should also be noted that pulse width compression is the same as pulse width expansion of the inverted signal.

The same process occurs in the fall mirror circuit 34 as occurs in the rise mirror circuit 32, except the fall mirror circuit 34 starts with the third inverted signal CLOCKMID, whereas the rise mirror circuit 32 starts with the input clock signal CLOCK. As previously described for the fall mirror circuit 34, the pulse width distortion by the second pull-up stage 38 is cancelled by the previously introduced pulse width change (duty cycle offset) of the second matching stage 36. Consequently, the desired CLOCKOUT signal, with an approximately 50% duty cycle, is generated at the output of the fall mirror circuit 34, such signal having been delayed (phase shifted) relative to the input CLOCK signal by both pull-up stages 38. High frequency operation of the clock shrink circuit 30 is assured once the rising output and falling output delays are matched.

With respect to the fall mirror circuit 34, the second matching stage 36 introduces a third pulse width change deviating from a 50% duty cycle to cancel out a fourth pulse width change (distortion) caused by the second pull-up stage 38, resulting in a substantially 50% duty cycle. In other words, the second matching stage 36 creates a second matching delay (difference between the rise and fall propagation delays of the second matching stage 36) to compensate for or cancel a second pull-up delay (difference between the rise and fall propagation delays of the second pull-up stage 38). The second matching and second pull-up delays have substantially equal but opposite effects on the pulse widths and therefore the duty cycle.

Figure 6:
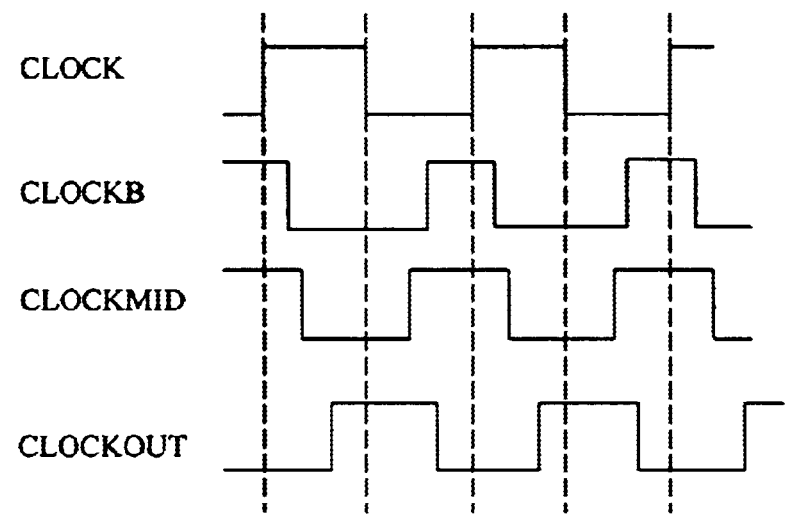
FIG. 6 is a timing diagram for the embodiment of the clock shrink circuit shown in FIG. 4 operating at a high frequency.

Referring to FIG. 6, the operation of the clock shrink circuit 30 is shown for a high frequency (generally above 4 GHz) by again showing in a timing diagram of the signals CLOCK, CLOCKB, CLOCKMID, and CLOCKOUT. As the frequency of the CLOCK signal is increased, both the waveforms CLOCKMID and CLOCKOUT maintain an approximately 50% duty cycle. If the rising and falling delays had not been balanced, the clock shrink circuit 30 would limit the maximum device frequency. The embodiment of the clock shrink circuit 30 of FIG. 4 fixes the duty cycle problem by allowing for greatly increased circuit bandwidth without significant increases in phase jitter. The shrink circuit 30 improves on the external duty cycles (signals CLOCKMID and CLOCKOUT) by creating an internal signal that has a non-ideal duty cycle (CLOCKB signal). Since the loading on the CLOCKB node is capacitively loaded significantly lower than other nodes in the rise mirror circuit 32 (also the case for the fall mirror circuit 34), it can be easily designed to operate with the duty cycle offset of the first matching stage 36; hence, the clock shrink circuit 30 does not limit the maximum device operation. The embodiment of FIG. 4 does not have the prior art shrink circuit's disadvantages of having higher jitter (which equates to lower device frequency of operation) and the upper frequency limit.

Figure 1:
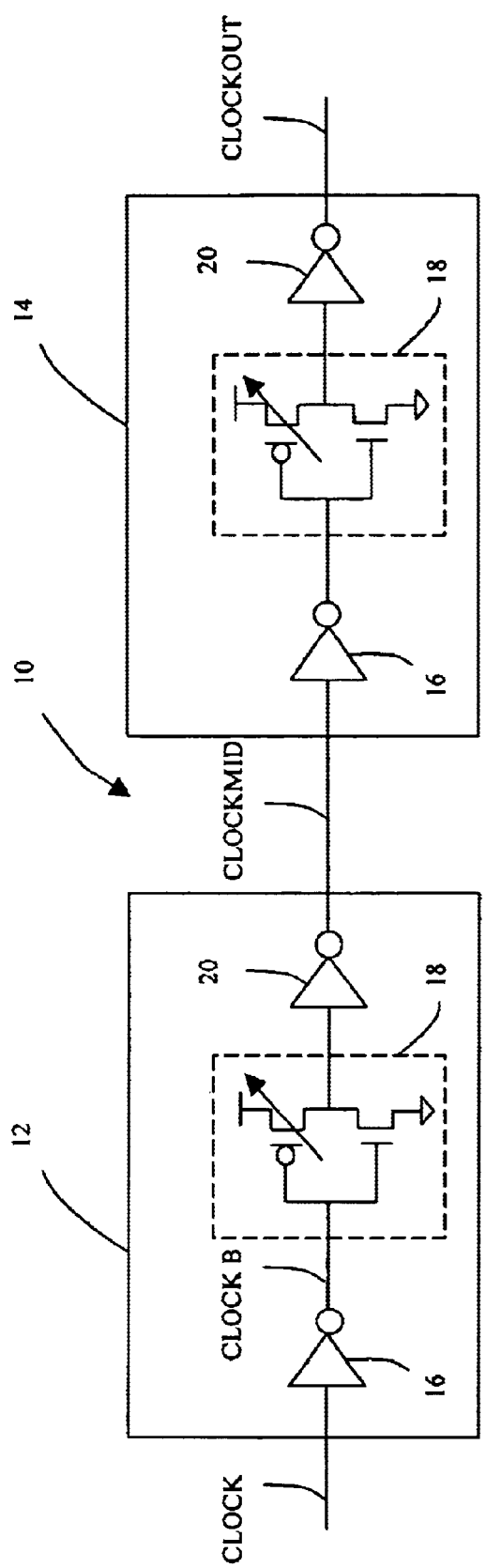
FIG. 1 is a schematic diagram of a prior art clock shrink circuit.
Figure 2:
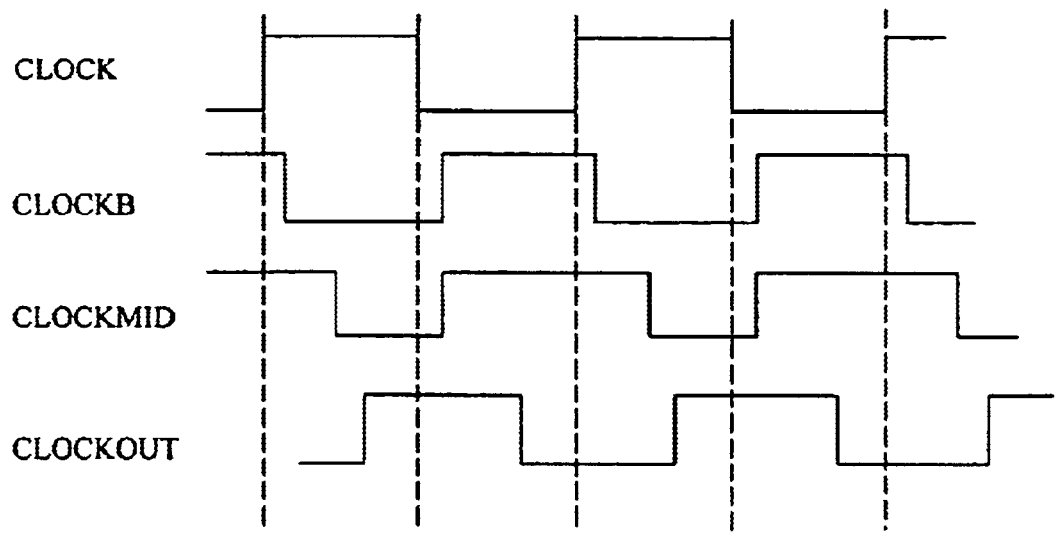
FIG. 2 is a timing diagram showing the prior art clock shrink circuit operating with a regular frequency.
Figure 3:
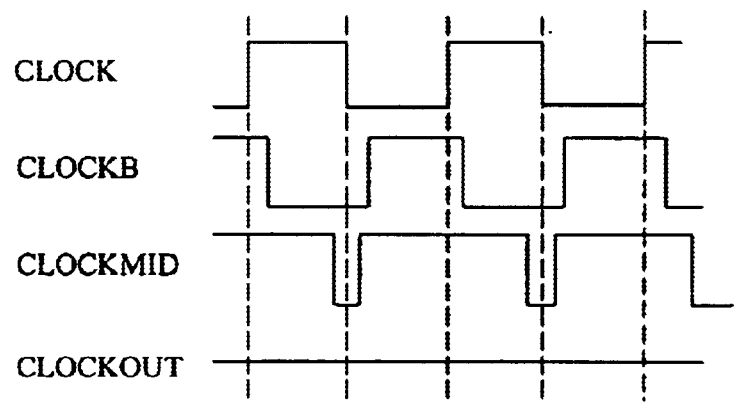
FIG. 3 is a timing diagram showing the prior art clock shrink circuit operating a high frequency.
Figure 7A:
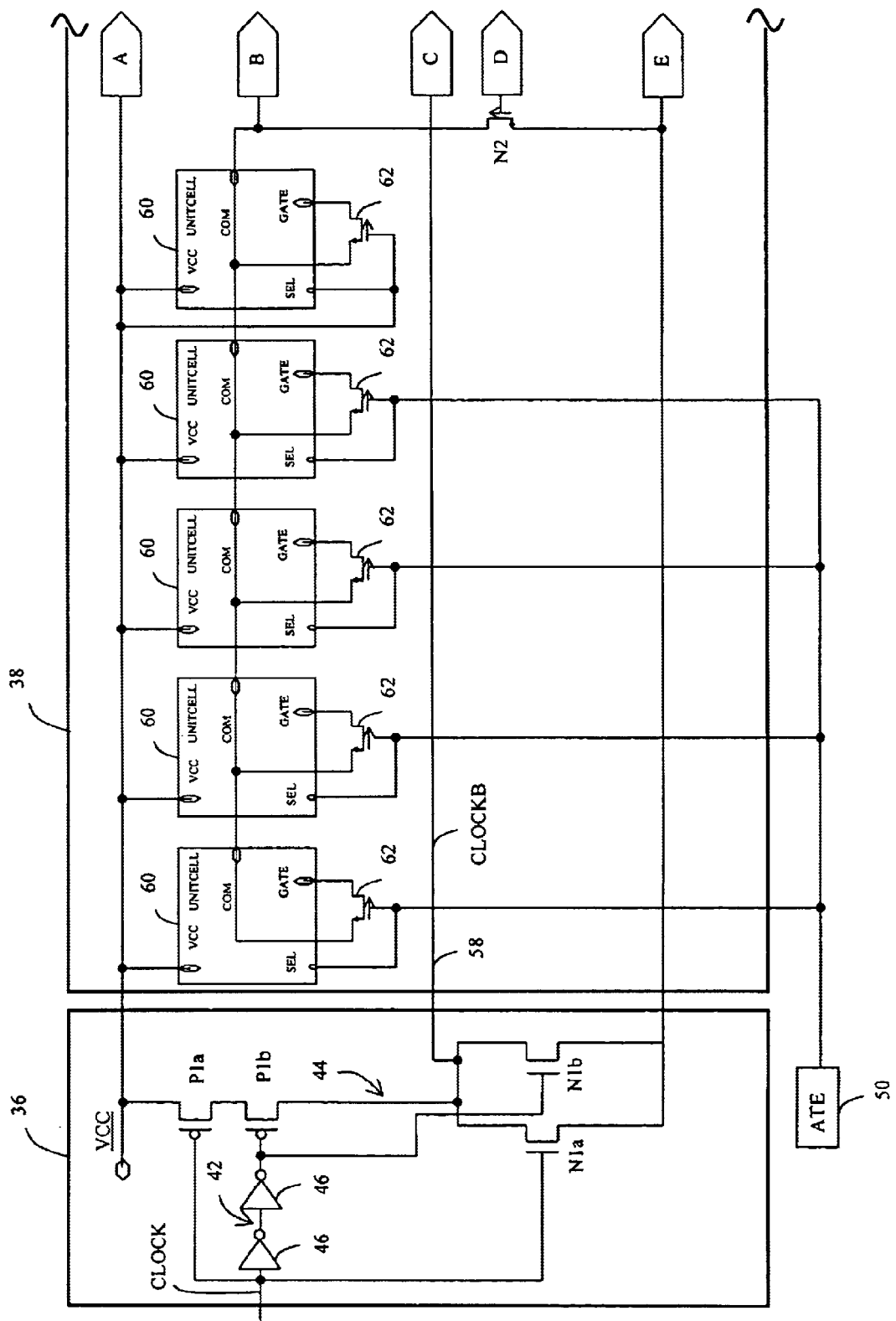
FIGS. 7A and 7B show a system with one embodiment of the clock shrink circuit operating with automatic test equipment.
Figure 7B:
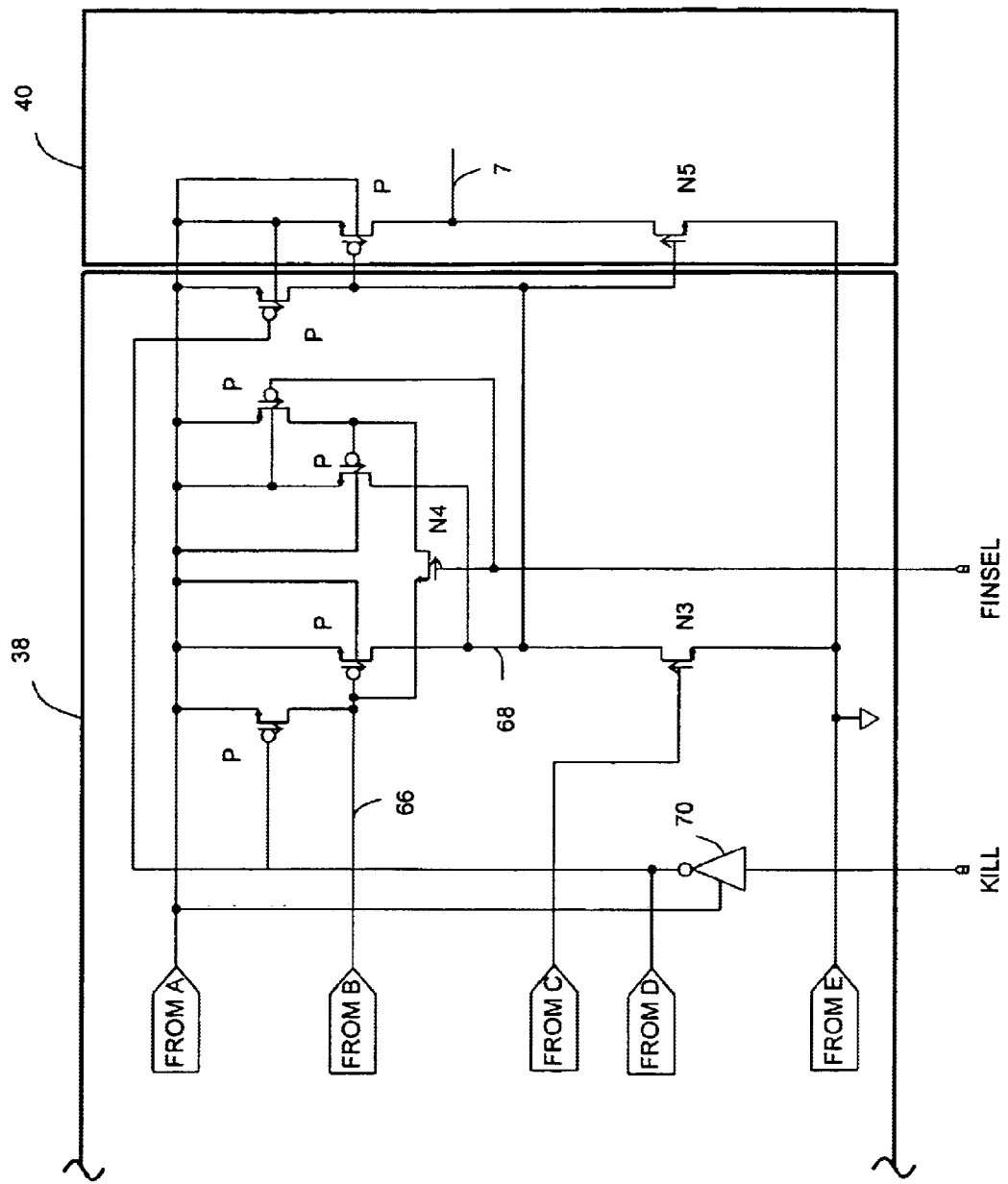

FIGS. 7A and 7B show a schematic diagram of the pull-up stages 38 of the rise and fall mirror circuits, with such stages 38 being coupled to an automated test equipment (ATE) and control circuitry 50. However, the pull-up stage 38 and ATE and control circuitry 50 are the same as found in the prior art design of FIG. 1 and therefore will not be described in detail. The ATE is indirectly coupled to the SEL input and a gate of the first transistor 62 of each of the unitcells 60. More specifically, the ATE does not directly drive the SEL input and gates, but drives the SEL input and the gates through the control circuitry, which is known logic, to provide known control signals ctr10, ctr11, ctr12, and ctr13 (not shown). Also, FIGS. 7A and 7B show the detailed schematics of the matching stage 36 and the output stage 40 shown in FIG. 4, in addition to the pull-up stage 38. In FIG. 4 the pull-up stages 38 in the rise mirror circuit 32 and the fall mirror circuit 34 are shown simplified as a single variable rise delay inverter. Based upon the control signals provided by the ATE and control circuitry 50, the pull-up stages 38 are set to introduce a phase delay into the CLOCKMID signal or the CLOCKOUT signal, depending upon which stage 38 is being considered, i.e., the one in the rise mirror circuit 32 or the one in the fall mirror circuit 34 respectively (see FIG. 4). The phase delay of each delay stage 38 is initially set in the middle range of the pull-up stages 38 and the ATE and control circuitry 50 may increase or decrease the amount of this phase delay. The more phase delay introduced, the more the output signals (CLOCKMID and CLOCKOUT) are delayed per edge respectively. In other words, the rise mirror circuit 32 only adds or subtracts delay to the rise edge of the CLOCKOUT signal (which is the fall edge of CLOCKMID) signal) and the fall mirror circuit 34 only adds or subtracts delay to the fall edge of CLOCKOUT signal. As the ATE and control circuitry 50 increases the phase delay of the pull-up stages 38, additional inverters generally are not required at the input of the NOR gate 44. In other words, once the difference in rising and falling propagation delays is corrected (compensated for) by using either 2, 4, 6, etc., inverters 46, the resulting duty cycle offset does not need to be changed with the introduction by the ATE and control circuitry 50 of differing amounts of phase shift for the CLOCKOUT signal; Note that the phase shifts of the first and second pull-up stages 38 are accumulative, but impact different edges.

The ATE of the ATE and control circuitry 50 is basically a sequence engine with memory to drive the stimulus and compare the results; hence, it may be described by the term "stimulus response machine". In this particular embodiment, the ATE comprises either an IMS Vanguard DM1000 tester (IMS is now owned by Creedence) or a Schlumberger S9000 series tester. Optional equipment may be used, such as a built-in scope and a PMU (parameteric measurement unit).

Referring to FIGS. 7A and 7B, the matching stags 36 includes the same components previously described with respect to FIG. 4: the non-inverting logic element 42 having at least the pair of inverters 46 and the NOR gate 44. The NOR gate 44 includes p-channel transistors P1$a$ and P1$b$, which are in series and connected between the supply voltage VCC and the node 58, and n-channel transistors N1$a$ and N1$b$, which are connected in parallel between the node 58 and ground. The matching stage 36 is show with the input signal CLOCK as is the case when the matching stage 36 is used in the rise mirror circuit 32; however, when the matching stage 36 is used in the fall mirror circuit 34 the input signal is CLOCKMID. The signal on the node 58 is the CLOCKB signal, as previously shown in FIG. 4.

Figure 8:
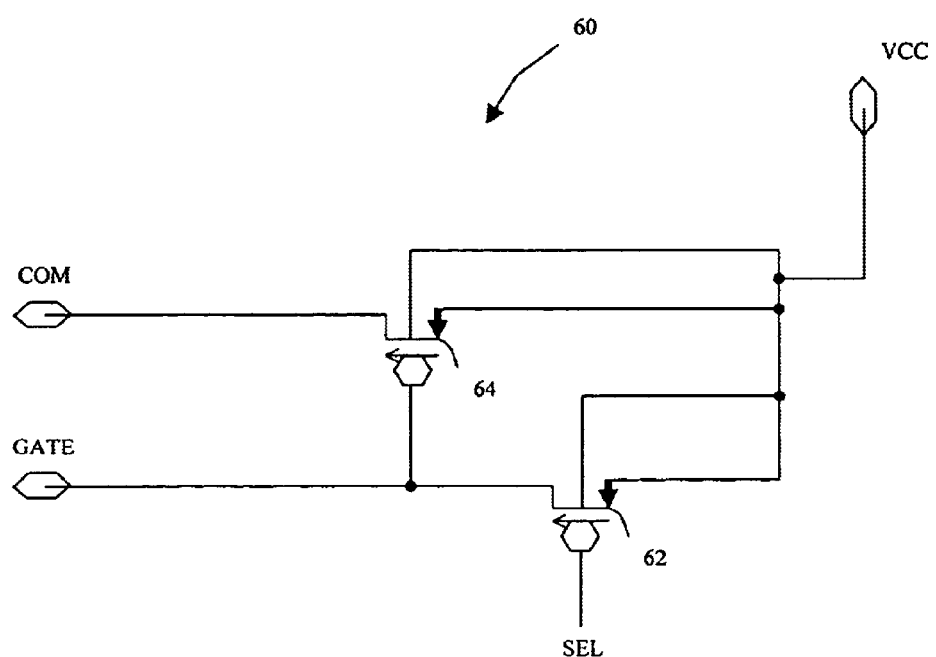
FIG. 8 is a schematic diagram of a unitcell in accordance with an embodiment of the invention.

The pull-up stage 38 includes a plurality of unitcells 60 coupled to the supply voltage VCC, with each unitcell 60 including a first p-channel transistor 62. All COM outputs are connected to the same node, namely node 66. Referring to FIG. 8, the unitcell 60 is illustrated in more detail and includes a second p-channel transistor 64. The unitcells 60 are arranged in a binary weighted scheme. Each set are connected to an individual signal driven by the ATE and control circuitry 50 (previously mentioned control signals ctr10-3) and are double the previous amount. For instance, the unitcell 60 on the right hand side is a single instance. To the left of it, the first unitcell 60 connected to the ATE 50 is 2 instances, then 4 instances, then 8 instances and finally 16 instances on the left hand side. Through the use of the digital input controls from the ATE and control circuitry 50, the bias voltage is precisely set for a gate of a p-channel transistor p2. By the unitcells 60 setting a bias voltage level, they control the delay through the pull-up stage 38.

Referring back to FIGS. 7A and 7B, the COM output of the last unitcell 60, the gate of the transistor p2, a drain of a p-channel transistor p3, a drain of an n-channel transistor n2, and an n-channel transistor n4 are commonly coupled to a node 66. The drain of the transistor p2 is connected to a node 68, the source of transistor p3 is connected to the supply voltage Vcc and a source of transistor n2 is coupled to ground. A transistor p4 has its source coupled to the supply voltage Vcc and its drain coupled to the node 68. The transistor p5 has its source coupled to the supply voltage Vcc and its drain commonly coupled with the transistor n4 and the gate of transistor p4. A transistor p6 has its source coupled to the supply voltage Vcc and its drain coupled to the node 68 and an n-channel transistor n5 in the output stage 40. An n-channel transistor n3 has its drain connected to the node 168 and its source to ground. An inverter 70 has its input connected to a KILL signal and its output coupled to the gates of transistors n2, p6, and p3. The gates of transistors n4 an p5 are connected to a FINSEL signal. The pull-up stage 38 has input signals to control the steps and a range select as well (coarse or fine), which modulates the step sizes (for example, 60ps range for coarse versus 40ps range for fine) via the FINSEL signal. There is another feature of the pull-up stage 38 that allows the circuit to ignore an input transition so as to keep the output signal constant via the KILL signal. The most common application for the KILL signal is to remove a clock from a series, commonly Known as "Kill-a-clock".

The output stage 40 includes a p-channel transistor p7 and the n-channel transistor n5. The transistor p7 has its source connected to the voltage supply Vcc, its drain connected to an output node 72, and its gate commonly connected to the drain of the transistor p6, the gate of the transistor n5, and the node 68. The transistor n5 has its drain connected to the output node 72 and its source connected to ground. The output node 72 provides either the CLOCKMID or CLOCK-OUT signal, depending upon whether the output stage 40 is located in the rise mirror circuit 32 or the fall mirror circuit 34.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An apparatus, comprising:
    an inverting first matching stage responsive to an input clock signal to generate a first inverted signal having a first matching delay, the first matching delay being a difference between a first rise and a first fall propagation time of the inverting first matching stage;
    an inverting first pull-up stage coupled to the inverting first matching stage and responsive to the first inverted signal to generate a second inverted signal having a first pull-up delay which is substantially equal to the first matching delay, the first pull-up delay being a difference between a second rise and a second fall propagation time of the inverting first pull-up stage;
    an inverting first output stage coupled to the inverting first pull-up stage to generate a third inverted signal in response to the second inverted signal; and
    the first pull-up stage being configured to generate a variable phase delay in the second inverted signal and the third inverted signal.

2. The apparatus according to claim 1, wherein the first matching stage includes a non-inverting logic element having an input to receive the input clock signal and a NOR gate with one input connected to the input of the non-inverting logic element and another input connected to an output of the non-inverting logic element.

3. The apparatus according to claim 2, wherein the non-inverting logic element includes at least two cascaded inverters.

4. The apparatus according to claim 1, wherein the second inverted signal and the third inverted signal have approximately the same duty cycle as the input clock signal.

5. The apparatus according to claim 2, wherein the input clock signal, the second inverted signal and the third inverted signal each have approximately a 50% duty cycle.

6. The apparatus according to claim 2, further comprising:
    an inverting second matching stage coupled to the inverting first output stage and responsive to the third inverted signal to generate a fourth inverted signal having a second matching delay, the second matching delay being a difference between a third rise and a third fall propagation time of the inverting second matching stage;
    an inverting second pull-up stage coupled to the inverting second matching stage and responsive to the fourth inverted signal to generate a fifth inverted signal having a second pull-up delay which is substantially equal to the second matching delay, the second pull-up, delay being a difference between a fourth rise and a fourth fall propagation time of the second pull-up stage; and
    an inverting second output stage coupled to the second the inverting second pull-up stage to generate a delayed clock signal in response to the fifth inverted signal.

7. A system comprising:
    an IC component having a clock generator to generate an input clock signal substantially having a 50% duty cycle; a rise mirror circuit including an inverting first matching stage coupled to the clock generator and response to the input clock signal to generate a first inverted signal with a first changed pulse width; an inverting first pull-up stage coupled to the inverting first matching stage and responsive to the first inverted signal to generate a second inverted signal having a second changed pulse width substantially with a 50% duty cycle, the first pull-up stage being configured to generate a variable amount of phase shift in the second inverted signal; and
    an automatic test equipment coupled to the inverting first pull-up stage to adjust the variable amount of the phase shift in the second inverted signal.

8. The system according to claim 7, wherein the first changed pulse width substantially equals the second changed pulse width; the first changed pulse width being a selected one of an increased pulse width or a decreased pulse width and the second changed pulse width being the other one of the increased pulse width or the decreased pulse width.

9. The system according to claim 8, wherein the first changed pulse width is the decreased pulse width and the second changed pulse width is the increased pulse width.

10. The system according to claim 7, wherein the inverting first matching stage includes a non-inverting logic element having an input to receive the input clock signal and a NOR gate with one input connected to the input of the non-inverting logic element and another input connected to an output of the non-inverting logic element.

11. The system according to claim 10, wherein the non-inverting logic element includes at least two cascaded inverters.

12. The system according to claim 7, further comprising:
    an inverting first output stage coupled to the first pull-up stage to generate a third inverted signal in response to the second inverted signal.

13. The system according to claim 12, wherein the inverting first pull-up stage is configured to generate a variable phase delay in the inverted second signal and the third inverted signal.

14. The system according to claim 13, wherein the second inverted signal and the third inverted signal have approximately the same duty cycle as the input clock signal.

15. The system according to claim 13, wherein the second inverted signal and the third inverted signal each have approximately a 50% duty cycle.

16. The system according to claim 12, further including:
    a falling mirror circuit including an inverting second matching stage coupled to the inverting first output stage of the rising mirror and responsive to the third inverted signal to generate a fourth inverted signal with a third changed pulse width; an inverting second pull-up stage coupled to the inverting second matching stage and responsive to the fourth inverted signal to generate a fifth inverted signal having a fourth changed pulse width substantially with a 50% duty cycle, the inverting second pull-up stage being configured to generate a variable amount of phase shift in the fifth inverted signal, and an inverting second output stage coupled to the inverting second pull-up stage and responsive to the fifth inverted signal to generate an output clock signal.

17. The system according to claim 12, the first changed pulse width introduces a duty cycle offset relative to the 50% duty cycle.

18. A method of operating a clock shrink circuit, comprising:

generating a clock signal with an approximately 50% duty cycle;

delaying one of the rising and falling edges of the clock signal more than the other edge and inverting the clock signal to generate a first inverted waveform with a first pulse width change;

using a variable first pull-up stage to delay one of the rising and falling edges of the first inverted waveform more than the other edge and inverting the first inverted waveform to generate a second inverted waveform with a second pulse width change;

adjusting the fist pulse width change to substantially equal the second pulse change to provide the second inverted waveform with an approximately 50% duty cycle; and adjusting the variable first pull-up stage to obtain a selected first phase shift of the second inverted waveform.

19. The method according to claim 18, further comprising:

inverting the second inverted waveform to generate a third inverted waveform having the first phase shift.

20. The method according to claim 18, wherein delaying one of the rising and falling edges of the clock signal more than the other edge includes introducing a duty cycle offset relative to the 50% duty cycle.

21. The method according to claim 19, further comprising:

delaying one of the rising and falling edges of the third inverted waveform more than the other edge and inverting the third inverted waveform to generate a fourth inverted waveform with a third pulse width change;

using a variable second pull-up stage to delay one of the rising and falling edges of the fourth inverted waveform more than the other edge and inverting the fourth inverted waveform to generate a fifth inverted waveform with a fourth pulse width change;

adjusting the third pulse width change to substantially equal the fourth pulse width change to provide the fifth inverted waveform with an approximately 50% duty cycle; and adjusting the variable second pull-up stage to obtain the selected second phase shift of the fifth inverted waveform.

22. The method according to claim 21, further comprising:

inverting the fifth inverted waveform to generate an output clock signal having the first and second phase shifts.

23. An apparatus, comprising:

an inverting first matching stage responsive to an input clock signal to generate a first inverted signal having a first matching delay, the first matching delay being a difference between a first rise and a first fall propagation time of the first matching stage;

an inverting first pull-up stage coupled to the first matching stage and responsive to the first inverted signal to generate a second inverted signal having a first pull-up delay which is substantially equal to the first matching delay, the first pull-up delay being a difference between a second rise and a second fall propagation time of the first pull-up stage; and the first matching stage including a non-inverting logic element having an input to receive the input clock signal and a NOR gate with one input connected of the input of the non-inverting logic element and another input connected to an output of the non-inverting logic element.

24. The apparatus according to claim 23, wherein the non-inverting logic element includes at least two cascaded inverters.

* * * * *

UNITED STATES PATENT AND TRADEMARK OFFICE
CERTIFICATE OF CORRECTION

| | | |
|---|---|---|
| PATENT NO. | : 6,956,420 B2 | Page 1 of 2 |
| APPLICATION NO. | : 10/676309 | |
| DATED | : October 18, 2005 | |
| INVENTOR(S) | : Darren Slawecki | |

It is certified that error appears in the above-identified patent and that said Letters Patent is hereby corrected as shown below:

Please delete the old drawing 7B and insert this new drawing 7B that is shown below.

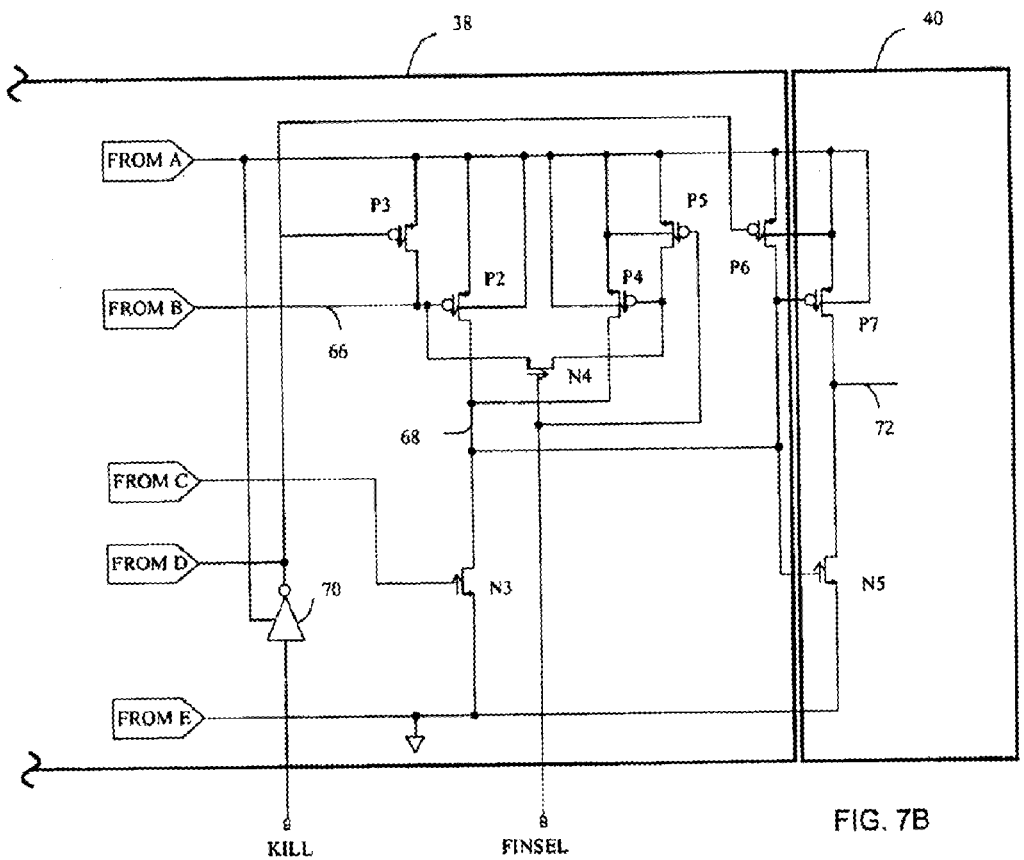

FIG. 7B

UNITED STATES PATENT AND TRADEMARK OFFICE
CERTIFICATE OF CORRECTION

PATENT NO. : 6,956,420 B2
APPLICATION NO. : 10/676309
DATED : October 18, 2005
INVENTOR(S) : Darren Slawecki It is certified that error appears in the above-identified patent and that said Letters Patent is hereby corrected as shown below:

Column 5
Line 49, "...delay stage 38..." should read --...pull-up stage 38...--.

Column 6
Line 11, "...stags 36..." should read --...stage 36...--.
Line 58, "...node 168..." should read --...node 68...--.

Column 8
Line 3 claim 6, "...pull-up, delay..." should read --...pull-up delay...--.

Column 9
Line 24 claim 18, "...the fist pulse..." should read --the first pulse...--.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO.       : 6,956,420 B2
APPLICATION NO.  : 10/676309
DATED            : October 18, 2005
INVENTOR(S)      : Darren Slawecki It is certified that error appears in the above-identified patent and that said Letters Patent is hereby corrected as shown below:

Please delete the old drawing 7B and insert this new drawing Fig. 7B that is shown below.

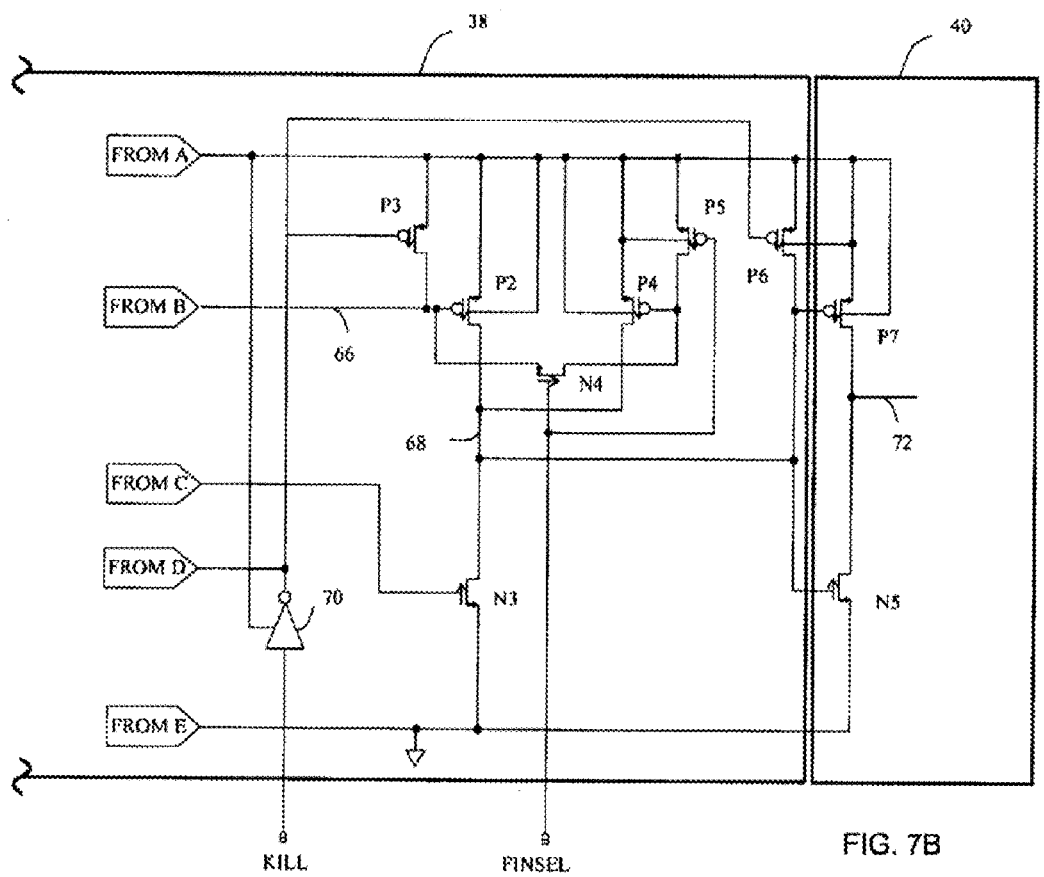

FIG. 7B

UNITED STATES PATENT AND TRADEMARK OFFICE
CERTIFICATE OF CORRECTION

PATENT NO. : 6,956,420 B2
APPLICATION NO. : 10/676309
DATED : October 18, 2005
INVENTOR(S) : Darren Slawecki It is certified that error appears in the above-identified patent and that said Letters Patent is hereby corrected as shown below:

Column 5
Line 49, "...delay stage 38..." should read --...pull-up stage 38...--.

Column 6
Line 11, "...stags 36..." should read --...stage 36...--.
Line 58, "...node 168..." should read --...node 68...--.

Column 8
Line 3 Claim 6, "...pull-up, delay..." should read --...pull-up delay...--.

Column 9
Line 24 Claim 7, "...the fist pulse..." should read --the first pulse...--.

Signed and Sealed this

Seventh Day of October, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,956,420 B2 | Page 1 of 1 |
| APPLICATION NO. | : 10/676309 | |
| DATED | : October 18, 2005 | |
| INVENTOR(S) | : Darren Slawecki | |

It is certified that error appears in the above-identified patent and that said Letters Patent is hereby corrected as shown below:

This certificate vacates the Certificate of Correction issued October 7, 2008. The certificates is a duplicate of the Certificate of Correction issued July 22, 2008. All requested changes were included in the Certificate of Correction issued July 22, 2008.

Signed and Sealed this

Twenty-fifth Day of November, 2008

JON W. DUDAS
*Director of the United States Patent and Trademark Office*